United States Patent
Tsai et al.

(10) Patent No.: US 9,312,357 B1
(45) Date of Patent: Apr. 12, 2016

(54) SEMICONDUCTOR DEVICE AND METHOD FOR MANUFACTURING THE SAME

(71) Applicant: UNITED MICROELECTRONICS CORPORATION, Hsinchu (TW)

(72) Inventors: Shih-Chang Tsai, Tainan (TW); Tzu-Chin Tseng, Tainan (TW); Hsiao-Ting Lin, Kaohsiung (TW); Chang-Yih Chen, Tainan (TW); Sam Lai, Taichung (TW)

(73) Assignee: United Microelectronics Corporation, Hsinchu (TW)

( * ) Notice: Subject to any disclaimer, the term of this patent is extended or adjusted under 35 U.S.C. 154(b) by 0 days.

(21) Appl. No.: 14/515,514

(22) Filed: Oct. 16, 2014

(30) Foreign Application Priority Data

Sep. 30, 2014 (CN) .......................... 2014 1 0524797

(51) Int. Cl.
H01L 21/02 (2006.01)
H01L 29/51 (2006.01)
H01L 29/49 (2006.01)
H01L 29/423 (2006.01)
H01L 21/28 (2006.01)
H01L 21/321 (2006.01)
H01L 21/768 (2006.01)

(52) U.S. Cl.
CPC ........ *H01L 29/511* (2013.01); *H01L 21/02175* (2013.01); *H01L 21/02178* (2013.01); *H01L 21/02244* (2013.01); *H01L 21/02247* (2013.01); *H01L 21/28079* (2013.01); *H01L 21/28158* (2013.01); *H01L 21/3212* (2013.01); *H01L 21/76897* (2013.01); *H01L 29/42364* (2013.01); *H01L 29/495* (2013.01); *H01L 21/02252* (2013.01)

(58) Field of Classification Search
CPC . H01L 29/511; H01L 21/3212; H01L 29/495; H01L 21/28079; H01L 21/02178; H01L 21/76897; H01L 21/02244; H01L 21/28158; H01L 21/02175; H01L 29/42364; H01L 21/02247; H01L 21/02252
See application file for complete search history.

(56) References Cited

U.S. PATENT DOCUMENTS

| | | | | |
|---|---|---|---|---|
| 2002/0068394 A1* | 6/2002 | Tokushige | ........ | H01L 21/76807 438/183 |
| 2010/0213555 A1* | 8/2010 | Hargrove | ........ | H01L 21/823842 257/411 |
| 2013/0043592 A1* | 2/2013 | Park | ..................... | H01L 29/4966 257/754 |

* cited by examiner

*Primary Examiner* — Roy Potter
*Assistant Examiner* — Paul Patton
(74) *Attorney, Agent, or Firm* — Ding Yu Tan

(57) ABSTRACT

A semiconductor device and a method for manufacturing the same. The method includes steps hereinafter. A substrate is provided with a first dielectric layer thereon. The first dielectric layer is provided with a trench. Then, a metal layer is formed to fill the trench and to cover the surface of the first dielectric layer. The metal layer is partially removed so that a remaining portion of the metal layer covers the first dielectric layer. A treatment process is performed to transform the remaining portion of the metal layer into a passivation layer on the top portion and a gate metal layer on the bottom portion. A chemical-mechanical polishing process is performed until the first dielectric layer is exposed so that a remaining portion of the passivation layer remains in the trench.

19 Claims, 5 Drawing Sheets

SEMICONDUCTOR DEVICE AND METHOD FOR MANUFACTURING THE SAME

FIELD OF THE INVENTION

The present invention generally relates to a semiconductor processing technology and, more particularly to, a semiconductor device and a method for manufacturing the same.

BACKGROUND OF THE INVENTION

The integrated circuit (IC) manufacturing technology have been moving forward as the metal-oxide-semiconductor field-effect transistors (MOSFET's) become smaller and smaller to improve the performances such as increased switching speed, lowered power consumption and higher level of integration. HKMG (high-k metal gate) technology promises to enable scaling of the transistors as well as reduced stand-by power due to a reduction in gate leakage.

In the HKMG technology, aluminum is often used as a conductor of the metal gate. The metal gate resistance ($R_{s\_MG}$) increases with the thinning of aluminum of the metal gate, which causes the device characteristics to change with the processing parameters of aluminum of the metal gate. For example, for I/O devices with a larger gate area than that of the core devices, dishing due to over-polishing often happens in low pattern density areas (for example, the gate area of an I/O device), during the chemical-mechanical polishing (CMP) planarization process. As a result, the metal gate resistance ($R_{s\_MG}$) increases with the thinning of aluminum of the metal gate to enhance the threshold voltage (V) and lower the turn-on current ($I_{on}$). Even worse, threshold voltage mismatch occurs for paired I/O devices due to thickness difference between the metal gates when dishing appears. Both of the above lead to chip malfunction.

To overcome the problems due to dishing of the metal gate by the CMP process, there is need in providing a semiconductor device and a method for manufacturing the same to prevent chip malfunction.

SUMMARY OF THE INVENTION

It is one object of the present invention to provide a semiconductor device and a method for manufacturing the semiconductor device using a treatment process on a metal gate prior to a chemical-mechanical polishing process on the metal gate so as to prevent dishing effects that may affect the characteristics of the device.

It is one object of the present invention to provide a semiconductor device and a method for manufacturing the semiconductor device using a treatment process on a metal gate prior to a chemical-mechanical polishing process on the metal gate so as to improve the matching of threshold voltages of paired large-area devices.

In order to achieve the foregoing object, in one embodiment, the present invention provides a method for manufacturing a semiconductor device. The method includes steps hereinafter. A substrate is provided with a first dielectric layer thereon. The first dielectric layer is provided with a trench. Then, a metal layer is formed to fill the trench and to cover the surface of the first dielectric layer. The metal layer is partially removed so that a remaining portion of the metal layer covers the first dielectric layer. A treatment process is performed to transform the remaining portion of the metal layer into a passivation layer on the top portion and a gate metal layer on the bottom portion. A chemical-mechanical polishing process is performed until the first dielectric layer is exposed so that a remaining portion of the passivation layer remains in the trench.

In order to achieve the foregoing object, in one embodiment, the present invention further provides a semiconductor device. The semiconductor device includes a substrate with a first dielectric layer and a gate structure thereon. The gate structure includes a gate dielectric layer, a gate metal layer and a passivation layer from bottom up. The passivation layer includes a compound including elements the gate metal layer is formed of.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiment. It is to be noted that the following descriptions of the preferred embodiment of this invention are presented herein for purpose of illustration and description only. It is not intended to be exhaustive or to be limited to the precise form disclosed.

The present invention will now be described more specifically with reference to the following embodiment. It is to be noted that the following descriptions of the preferred embodiment of this invention are presented herein for purpose of illustration and description only. It is not intended to be exhaustive or to be limited to the precise form disclosed.

Please refer to FIG. 1A to FIG. 1E for cross-sectional views showing steps for a method for manufacturing a semiconductor device 100 according to one embodiment of the present invention.

Figure 1A:
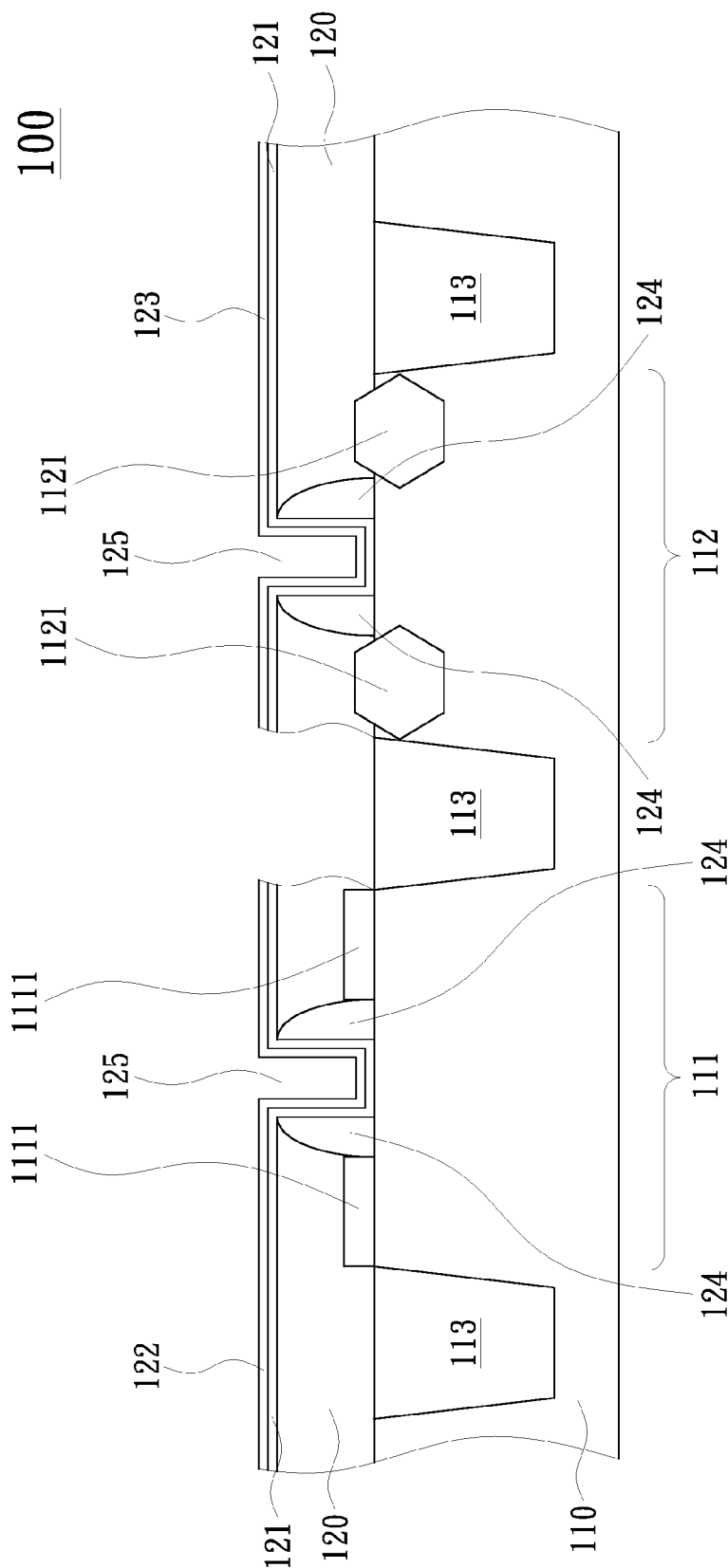
FIG. 1A to FIG. 1E are cross-sectional views showing steps for a method for manufacturing a semiconductor device according to one embodiment of the present invention.

As shown in FIG. 1A, a substrate 110 is provided with a first dielectric layer 120 thereon. The first dielectric layer 120 includes at least one trench 125. In some embodiments, the substrate 110 can be a silicon substrate, a III-V semiconductor substrate, a sapphire substrate, a silicon on insulator (SOI) substrate, or any other substrates with electronic components thereon. For example, as shown in FIG. 1A, the substrate 110 is a silicon substrate having at least one n-channel MOSFET 111 and at least one p-channel MOSFET 112 that are separated by a shallow trench isolation (STI) structure 113 therebetween. In the present embodiment, the first dielectric layer 120 is an oxide layer or any other low-k dielectric layers formed by deposition. For example, the first dielectric layer 120 can be a carbon-doped oxide layer. Furthermore, the (at least one) trench 125 is defined by a sidewall of a spacer 124. The spacer 124 can be formed of, for example, nitride. In FIG. 1A, the source/drain regions 1111 of the n-channel MOSFET 111 may include silicon doped with group V elements such as phosphor (P) so that there is provided a tensile strain in the channel between the source/drain regions 1111 to improve electron mobility. On the other hand, the source/drain regions 1121 of the p-channel MOSFET 112 may include silicon-germanium (SiGe). The lattice constant of silicon-germanium is larger than that of silicon so that there is provided a compressive strain in the channel between the source/drain regions 1121 to improve hole mobility.

Moreover, a second dielectric layer 121 and a stacked layer 122 (123) are formed in sequence to cover the bottom surface of the trench 125, the sidewall of the spacer 124 and the top surface of the first dielectric layer 120. In some embodiments, the second dielectric layer 121 is a high-k dielectric layer including, for example, hafnium-based dielectric materials, such as $HfO_2$ and HfSiO, etc. The stacked layer 122 (123) includes a barrier layer and a work function metal layer. For example, in the stacked layer 122 of the n-channel MOSFET 111, the barrier layer may include a titanium nitride (TiN) layer and a tantalum nitride (TaN) layer. The work function metal layer may include a titanium-aluminum (TiAl) alloy layer. In the stacked layer 123 of the p-channel MOSFET 112, the barrier layer may include a titanium nitride (TiN) layer and a tantalum nitride (TaN) layer. The work function metal layer may include a two-layered structure including a titanium-aluminum (TiAl) alloy layer on the top and a titanium nitride (TiN) layer at the bottom thereof. However, the present invention is not limited to the two-layered structure as above. Modifications within the scope of the present invention may be made by those of ordinary skills in the art.

Figure 1B:
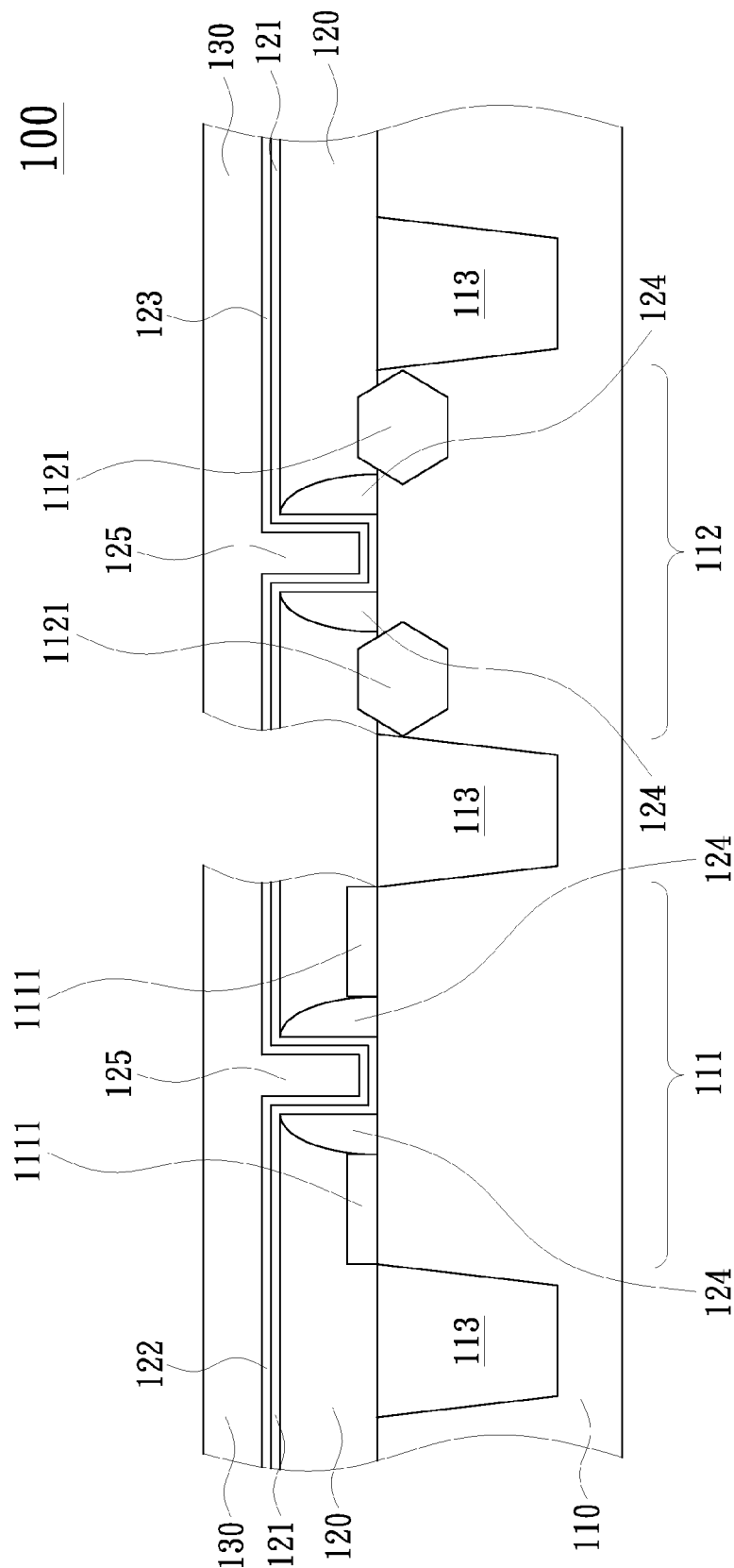

Then, as shown in FIG. 1B, a metal layer 130 is deposited to fill the trench 125 and cover the surface of the first dielectric layer 120. In some embodiments, the metal layer 130 may include Al, W or Cu. However, the present invention is not limited to the material the metal layer 130 is made of. Modifications within the scope of the present invention may be made by those of ordinary skills in the art.

Figure 1C:
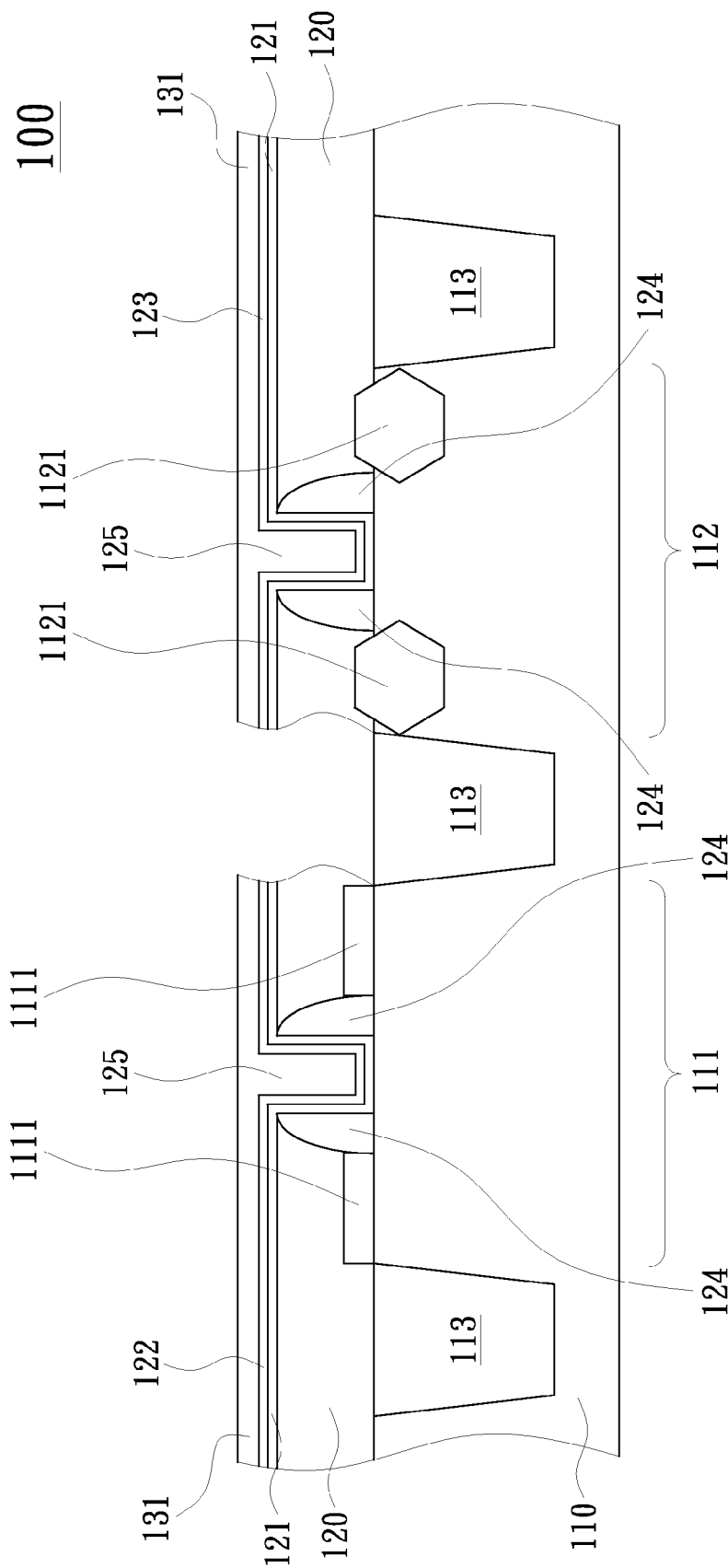

As shown in FIG. 1C, the metal layer 130 is partially removed so that a remaining portion 131 of the metal layer 130 covers the first dielectric layer 120. In some embodiments, the metal layer 130 is partially removed by processes such as etching and chemical-mechanical polishing, etc. The thickness of the remaining portion 131 is smaller than 20 nm. Preferably, the remaining portion 131 is thinner than 10 nm.

Figure 1D:
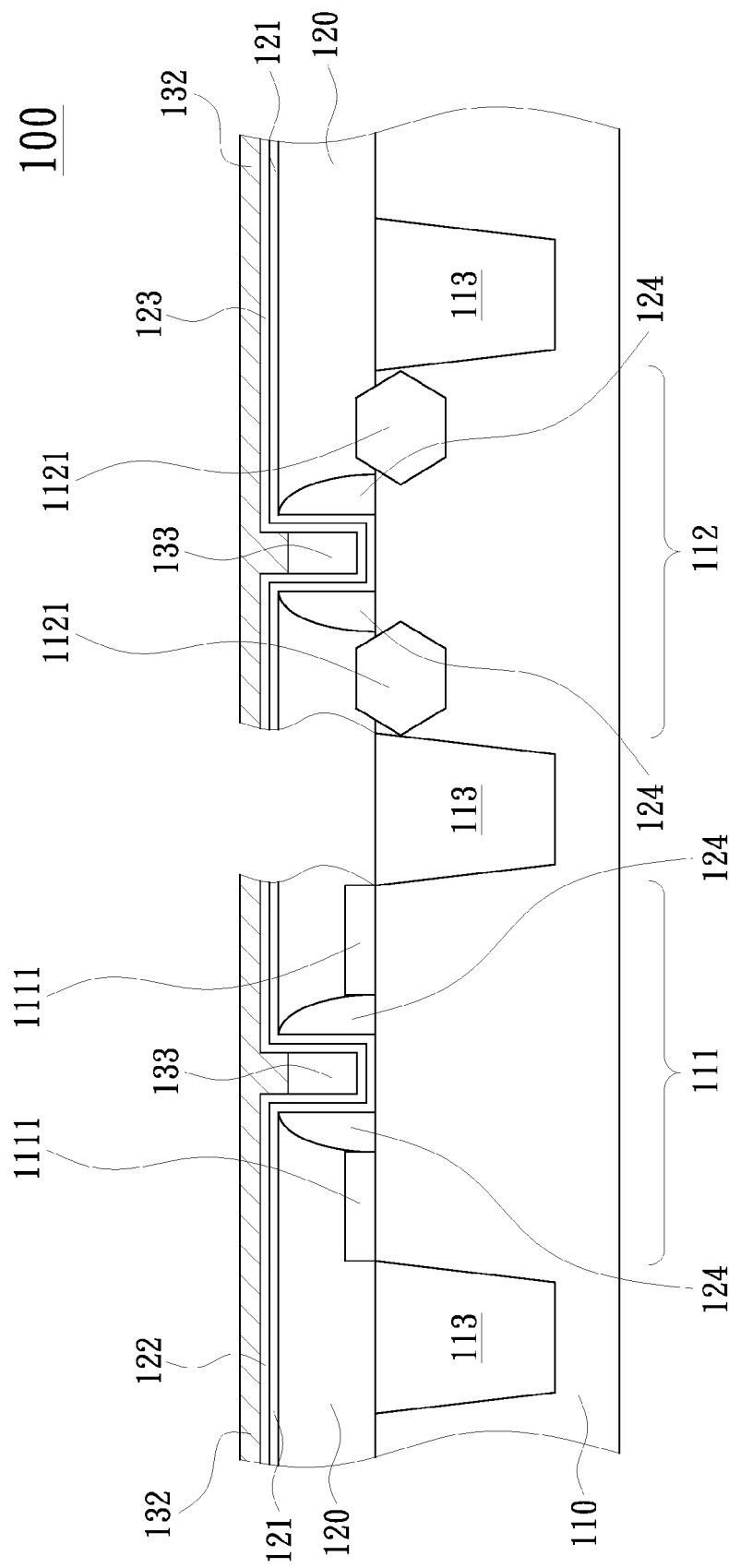

Afterwards, in FIG. 1D, a treatment process is performed so that a top portion of the remaining portion 131 of the metal layer 130 is transformed into a passivation layer 132 and a bottom portion of the remaining portion 131 of the metal layer 130 is transformed into a gate metal layer 133. A shown in FIG. 1D, the gate metal layer 133 is bulk-shaped. In some embodiments, the treatment process is performed by plasma-enhanced oxidation or plasma-enhanced nitridation. Accordingly, the passivation layer 132 includes a compound having elements that the gate metal layer 133 is formed of. More particularly, the passivation layer 132 may include metal oxide or metal nitride.

Figure 1E:
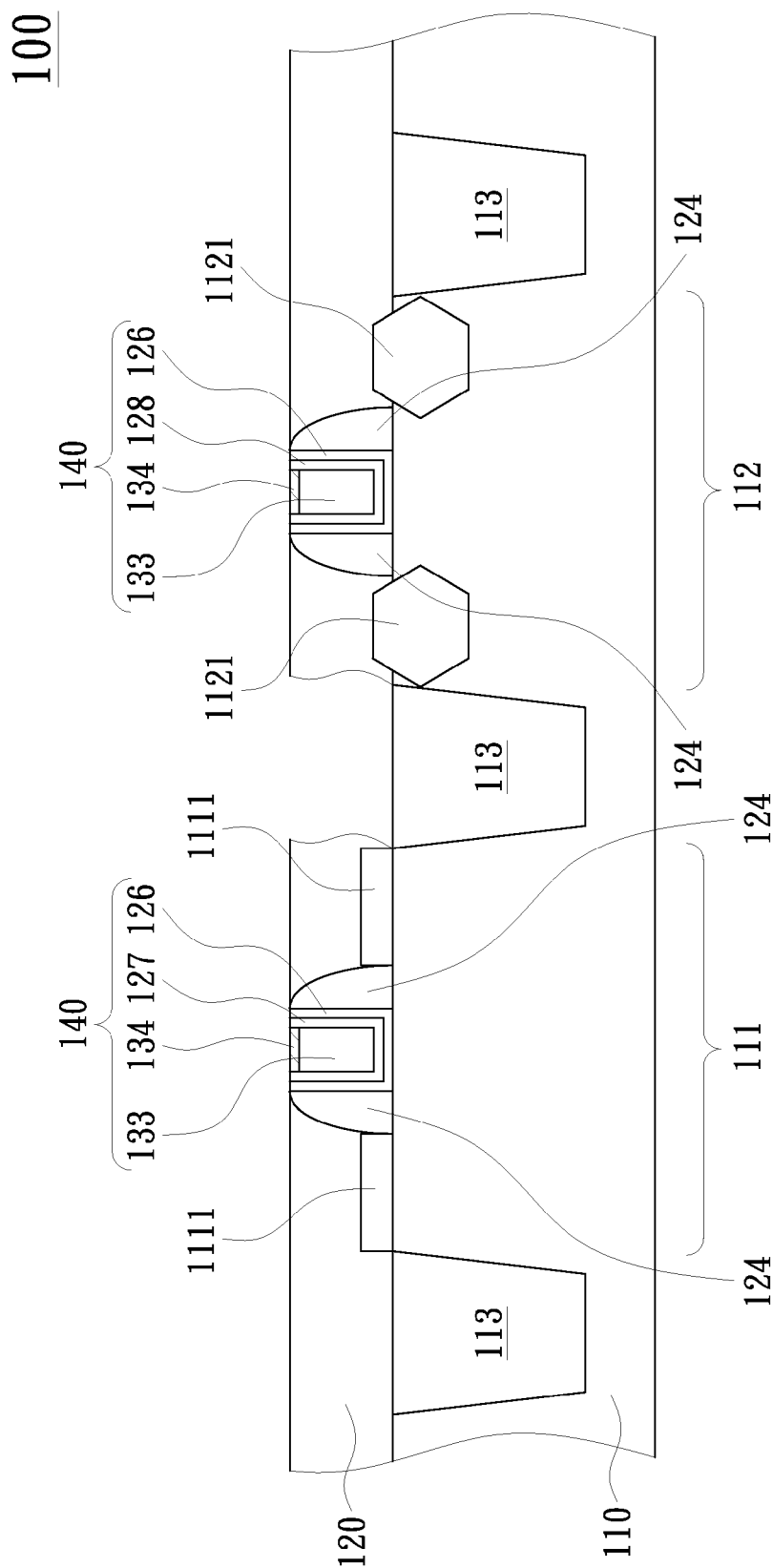

At last, as shown in FIG. 1E, a chemical-mechanical polishing (CMP) process is performed until the first dielectric layer 120 is exposed so that a remaining portion 134 of the passivation layer 132 remains in the trench 125. In some embodiments, the thickness of the remaining portion 134 of the passivation layer 132 is smaller than 10 nm. Preferably, the thickness of the remaining portion 134 is in a range from 2 nm to 8 nm.

Furthermore, in some embodiments, a contact plug (not shown) is provided penetrating the remaining portion 134 of the passivation layer 132 to connect the gate metal layer 133.

Accordingly, by the use of the method described from FIG. 1A to FIG. 1E, the semiconductor device 100 is manufactured, as shown in FIG. 1E. The semiconductor device 100 includes a substrate 110 with a first dielectric layer 120 and a gate structure 140 thereon. The gate structure 140 includes a gate dielectric layer 126, a gate metal layer 133 and a (passivation layer) remaining portion 134 from bottom up. The passivation layer remaining portion 134 includes a compound including elements that the gate metal layer 133 is formed of.

In some embodiments, the gate structure 140 is defined by the sidewall of the spacer 124. The gate structure 140 may further include a stacked layer 127 (128) provided between the gate dielectric layer 126 and the gate metal layer 133. The gate dielectric layer 126 and the stacked layer 127 (128) are U-shaped, and configured along the sidewall of the spacer 124 and the bottom surface of the trench 125. Furthermore, the semiconductor device 100 may further include a contact plug (not shown) penetrating the passivation layer remaining portion 134 to connect the gate metal layer 133. It is noted that the gate structure in FIG. 1E of the one embodiment of present invention is a high-k last gate structure. However, the present invention is not limited thereto. In other words, the disclosure of the present invention may also be used to manufacture a semiconductor device with a high-k first gate structure.

With of realization of the present invention, the passivation layer 134 of the semiconductor device 100 in FIG. 1E can prevent dishing effects due to over-polishing of the gate area of a semiconductor device. Therefore, the present invention is presented to improve I-V characteristics, avoid threshold voltage mismatch for paired I/O devices, and prevent chip malfunction.

It is noted that, even if there is dishing in the passivation layer 132 after the CMP process, the thickness of the gate metal layer 133 underneath the passivation layer 132 still remains unchanged. Electrical characteristics and matching of threshold voltages remain unchanged accordingly.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for manufacturing a semiconductor device, comprising steps of:
    providing a substrate with a first dielectric layer thereon, said first dielectric layer having a trench;
    depositing a metal layer filling said trench and covering a surface of said first dielectric layer;
    partially removing said metal layer so that a remaining portion of said metal layer covers said first dielectric layer;
    performing a treatment process to transform a top portion of said remaining portion of said metal layer into a passivation layer; and
    performing a chemical-mechanical polishing (CMP) process until said first dielectric layer is exposed so that a remaining portion of said passivation layer remains in said trench.

2. The method of claim 1, wherein said trench is defined by a sidewall of a spacer.

3. The method of claim 2, further comprising a step, prior to depositing said metal layer, of:
    forming a second dielectric layer and a stacked layer covering a bottom portion of said trench, said sidewall of said spacer and said surface of said first dielectric layer.

4. The method of claim 1, further comprising a step of:
    forming a contact plug penetrating said remaining portion of said passivation layer to connect said gate metal layer.

5. The method of claim 1, wherein said first dielectric layer comprises an oxide layer.

6. The method of claim 3, wherein said second dielectric layer comprises a high-k dielectric layer.

7. The method of claim 2, wherein said spacer comprises a nitride layer.

8. The method of claim 1, wherein said treatment process is performed by plasma-enhanced oxidation or plasma-enhanced nitridation.

9. The method of claim 1, wherein said metal layer comprises Al, W or Cu.

10. The method of claim 1, wherein said remaining portion of said metal layer is thinner than 20 nm.

11. The method of claim 1, wherein said remaining portion of said passivation layer is thinner than 10 nm.

12. A semiconductor device, comprising:
   a substrate with a first dielectric layer and a gate structure thereon, said gate structure comprising a gate dielectric layer, a gate metal layer and a passivation layer from bottom up;
   wherein said passivation layer is thinner than 10 nm and comprises a compound, said compound comprising elements said gate metal layer is formed of.

13. The semiconductor device of claim 12, wherein said gate structure is defined by a sidewall of a spacer.

14. The semiconductor device of claim 13, further comprising a stacked layer disposed between said gate dielectric layer and said gate metal layer, wherein said gate dielectric layer and said stacked layer are U-shaped and configured along said sidewall of said spacer and a bottom surface of a trench defined by said sidewall of said spacer.

15. The semiconductor device of claim 12, further comprising a contact plug penetrating said passivation layer to connect said gate metal layer.

16. The semiconductor device of claim 12, wherein said first dielectric layer comprises an oxide layer.

17. The semiconductor device of claim 12, wherein said gate dielectric layer comprises a high-k dielectric layer.

18. The semiconductor device of claim 13, wherein said spacer comprises a nitride layer.

19. The semiconductor device of claim 12, wherein said metal layer comprises Al, W or Cu.

* * * * *